US008013686B2

(12) United States Patent
Kuo et al.

(10) Patent No.: US 8,013,686 B2

(45) Date of Patent: Sep. 6, 2011

(54) MINIATURIZED MULTILAYER HYBRID-PHASE SIGNAL SPLITTER CIRCUIT

(75) Inventors: Chun-Lin Kuo, Taipei (TW); Che-Chung Kuo, Taipei (TW); Huei Wang, Taipei (TW)

(73) Assignee: National Taiwan University, Taipei (TW)

( * ) Notice: Subject to any disclaimer, the term of this patent is extended or adjusted under 35 U.S.C. 154(b) by 114 days.

(21) Appl. No.: 12/391,726

(22) Filed: Feb. 24, 2009

(65) Prior Publication Data

US 2010/0052812 A1 Mar. 4, 2010

(30) Foreign Application Priority Data

Aug. 29, 2008 (TW) ................................ 97133401 A

(51) Int. Cl.
*H01P 5/12* (2006.01)
*H03H 7/18* (2006.01)
*H01P 1/18* (2006.01)

(52) U.S. Cl. .......................... 333/119; 333/128; 333/138

(58) Field of Classification Search .................. 333/109, 333/110, 111, 112, 115, 116, 25, 26, 117, 333/119, 128, 138
See application file for complete search history.

(56) References Cited

U.S. PATENT DOCUMENTS 7,167,698 B2 * 1/2007 Katz .............................. 455/326
7,605,672 B2 * 10/2009 Kirkeby ........................... 333/26
7,667,556 B2 * 2/2010 Ezzeddine ..................... 333/131

OTHER PUBLICATIONS

Chun-Lin Kuo et al.; "A Novel Reduced-Size Rat-Race Broadside Coupler and Its Application for CMOS Distributed Sub-Harmonic Mixer"; IEEE Microwave and Wireless Components Letters; vol. 18, No. 3, Mar. 2008; pp. 194-196.

* cited by examiner

*Primary Examiner* — Dean O Takaoka

(74) *Attorney, Agent, or Firm* — Peter F. Corless; Steven M. Jensen; Edwards Angell Palmer & Dodge LLP

(57) ABSTRACT

A miniaturized multilayer hybrid-phase signal splitter circuit is proposed, which is fully equivalent in function to a conventional rat-race coupler, but with a specialized circuit layout structure that allows its IC implementation to be more miniaturized than the conventional rat-race coupler. The proposed hybrid-phase signal splitter circuit features the use of a multilayer substrate for the layout of six transmission lines in such a manner that the transmission lines in the middle layer are inductively coupled to the transmission lines on the overlying layer as well as the transmission lines on the underlying layer to form a Marchand balun. In IC implementation, the required layout area is only about 10% of the layout area for the conventional rat-race coupler.

24 Claims, 5 Drawing Sheets

MINIATURIZED MULTILAYER HYBRID-PHASE SIGNAL SPLITTER CIRCUIT

BACKGROUND OF THE INVENTION

1. Field of the Invention

This invention relates to millimeter-wave (MMW) circuit technology, and more particularly, to a miniaturized multilayer hybrid-phase signal splitter circuit whose signal processing function is fully equivalent to a conventional rat-race coupler, but having a specialized circuit layout structure that allows its IC implementation to be more miniaturized than the conventional rat-race coupler.

2. Description of Related Art

Rat-race couplers are also referred to as hybrid-phase ring couplers which are typically used as a circuit component in a millimeter-wave (MMW) mixer. In operation, the rat-race coupler receives the input of a carrier signal RF and the input of a local oscillation signal LO and splits the RF signal into a pair of in-phase output signals (i.e., phase difference is 0 degree) and also splits the LO signal into a pair of opposite-phase output signals (i.e., phase difference is 180 degrees) which can be used by the mixer circuit for generation of an intermediate frequency (IF) signal. The jargon “rat race” in the name of this device comes from the fact that its body structure includes a ring-shaped waveguide that looks like a circular cage used for rat race.

In structure, a rat-race coupler includes a ring-shaped 3/2-wavelength waveguide and four leg-like quarter-wavelength waveguides protruding from the ring-shaped waveguide. Since the structure and function of the rat-race coupler is well-known, detailed description thereof will not be given in this specification.

One drawback to the rat-race coupler, however, is that it has a relatively bulky size that makes it unsuitable for use in miniaturized integrated circuitry. Solutions to this problem include, for example, the following US patents:

(1) U.S. Pat. No. 7,068,122 “Miniatured multilayer balun”;
(2) U.S. Pat. No. 7,157,986 “Three-dimensional balun”;
(3) U.S. Pat. No. 5,634,208 “Multilayer transmission line hybrid”.

The U.S. Pat. No. 7,068,122 “Miniatured multilayer balun” discloses a multilayer architecture for construction of a balun with miniaturized size for integration to mixers. One drawback to this patent, however, is that it can only generate a pair of opposite-phase output signals and cannot provide a pair of in-phase output signals, and therefore cannot be used in place of the rat-race coupler.

The U.S. Pat. No. 7,157,986 “Three-dimensional balun” discloses a 3-dimensional architecture for balun construction. However, similar to the aforementioned patent, this patent can only generate a pair of opposite-phase output signals and cannot provide a pair of in-phase output signals, and therefore cannot be used in place of the rat-race coupler.

The U.S. Pat. No. 5,634,208 “Multilayer transmission line hybrid” discloses a multilayer architecture as an improvement on the conventional rat-race coupler. However, this improved rat-race coupler is nonetheless relatively bulky in size for miniaturized IC implementation.

SUMMARY OF THE INVENTION

It is therefore an objective of this invention to provide a miniaturized multilayer hybrid-phase signal splitter circuit whose signal processing function is fully equivalent to a conventional rat-race coupler but with a reduced smaller size that allows miniaturized IC implementation.

In application, the miniaturized multilayer hybrid-phase signal splitter circuit according to the invention can be integrated to a mixer for providing a signal mixing function for a carrier signal RF and a local oscillation signal LO.

In architecture, the miniaturized multilayer hybrid-phase signal splitter circuit according to the invention comprises: (A) a multilayer substrate; (B) a first transmission line; (C) a second transmission line; (D) a third transmission line; (E) a fourth transmission line; (F) a fifth transmission line; and (G) a sixth transmission line.

The miniaturized multilayer hybrid-phase signal splitter circuit of the invention features the use of a multilayer substrate (3-layer substrate) for layout of the transmission lines in such a manner that the transmission lines in the middle layer are inductively coupled to the transmission lines on the overlying layer as well as the transmission lines on the underlying layer to form a Marchand balun. Moreover, these 6 transmission lines are each patterned into a spiral topology.

Compared to the conventional rat-race coupler, the invention has the advantage of a miniaturized size for IC implementation due to the use of the multilayer substrate (3-layer substrate) for the layout of 6 transmission lines and a spiral topology for the patterning of these 6 transmission lines. Specifically speaking, the required layout area for the invention is only about 10% of the layout area for the conventional rat-race coupler.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The miniaturized multilayer hybrid-phase signal splitter circuit according to the invention is disclosed in full details by way of preferred embodiments in the following with reference to the accompanying drawings. The invention is hereinafter referred to in short as “hybrid-phase signal splitter circuit”.

Function and Application of the Invention

Figure 1:
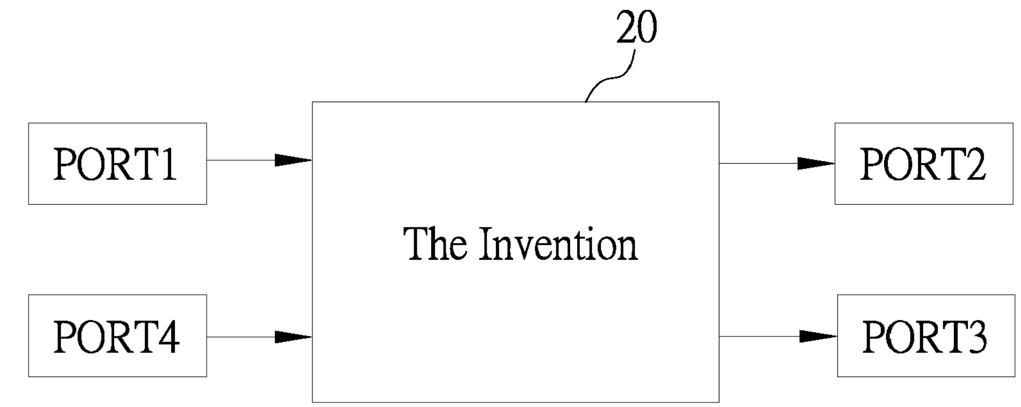
FIG. 1 is a schematic diagram showing a generalized I/O functional model of the invention.
Figure 2A:
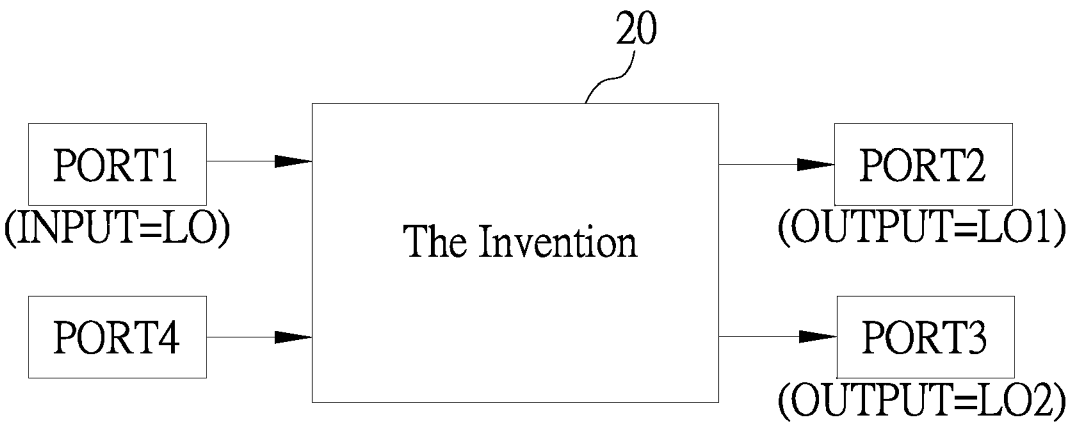
FIG. 2A is a schematic diagram showing the I/O functional model of the invention when used for generating a pair of opposite-phase output signals.
Figure 2B:
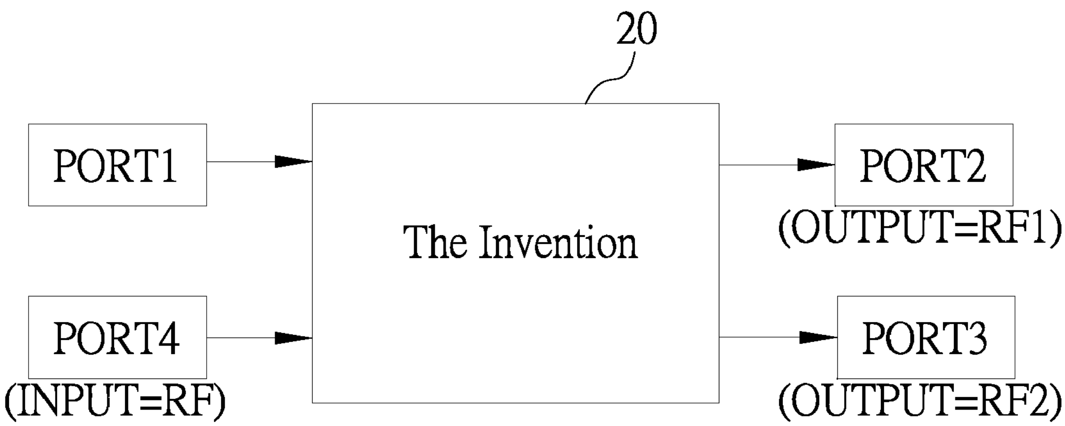
FIG. 2B is a schematic diagram showing the I/O functional model of the invention when used to generate a pair of in-phase output signals.

In application, the hybrid-phase signal splitter circuit of the invention 20 is fully equivalent in function to a conventional rat-race coupler, except with a different architecture that can be implemented with a miniaturized size. FIG. 1 and FIGS. 2A-2B show the I/O (input/output) functional model of the hybrid-phase signal splitter circuit of the invention 20.

Referring first to FIG. 1, the hybrid-phase signal splitter circuit of the invention 20 has an I/O interface including a first port PORT1, a second port PORT2, a third port PORT3, and a fourth port PORT4.

Referring next to FIG. 2A, in operation, when the first port PORT1 receives a first input signal, such as a local oscillation signal LO, the hybrid-phase signal splitter circuit of the invention 20 will output a pair of opposite-phase output signals LO1 and LO2 respectively at the second port PORT2 and the third port PORT3, where LO1 and LO2 both have the same frequency as LO and are opposite in phase with a phase difference of 180°.

Referring further to FIG. 2B, when the fourth port PORT4 receives a second input signal, such as a carrier signal RF, the hybrid-phase signal splitter circuit of the invention 20 will output a pair of in-phase output signals RF1 and RF2 respectively at the second port PORT2 and the third port PORT3, where RF1 and RF2 both have the same frequency as RF and are in phase with a phase difference of 0°.

Figure 3:
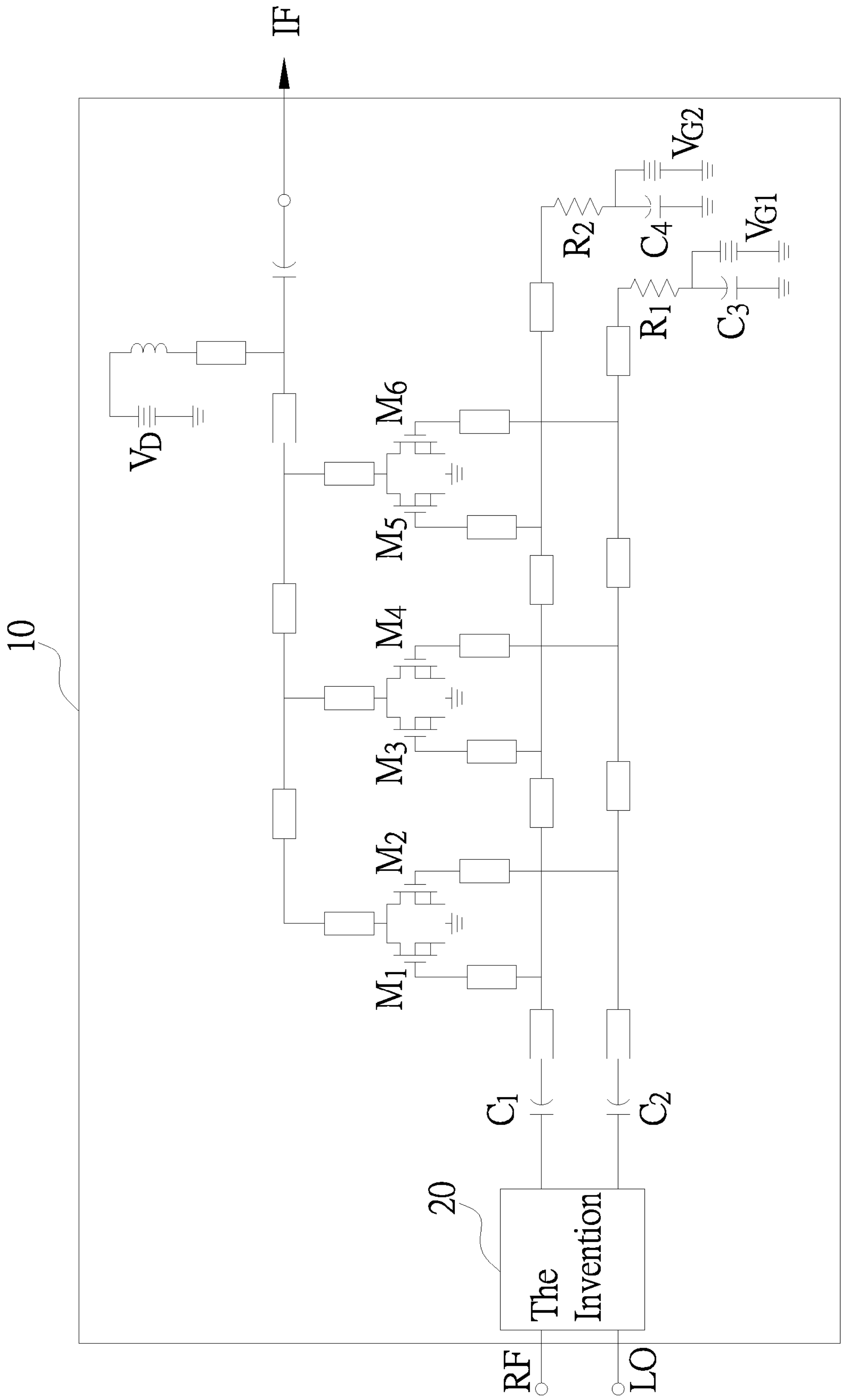
FIG. 3 is a schematic diagram showing an application example of the invention used for integration to a mixer.

FIG. 3 shows an application example of the hybrid-phase signal splitter circuit of the invention 20, which is here integrated as a circuit component to a mixer 10. In operation, the mixer 10 receives the input of a carrier signal RF, such as a 32 GHz to 70 GHz carrier signal, and mixes the carrier signal RF with a local oscillation signal LO to thereby generate an intermediate frequency (IF) signal. Since the principle of mixer operation is well known in the electronics industry, details thereof will not be given in this specification.

Beside the application with mixers, the hybrid-phase signal splitter circuit of the invention 20 can also be used as power splitters, phase shifters, to name a few.

Architecture of the Invention

Figure 4:
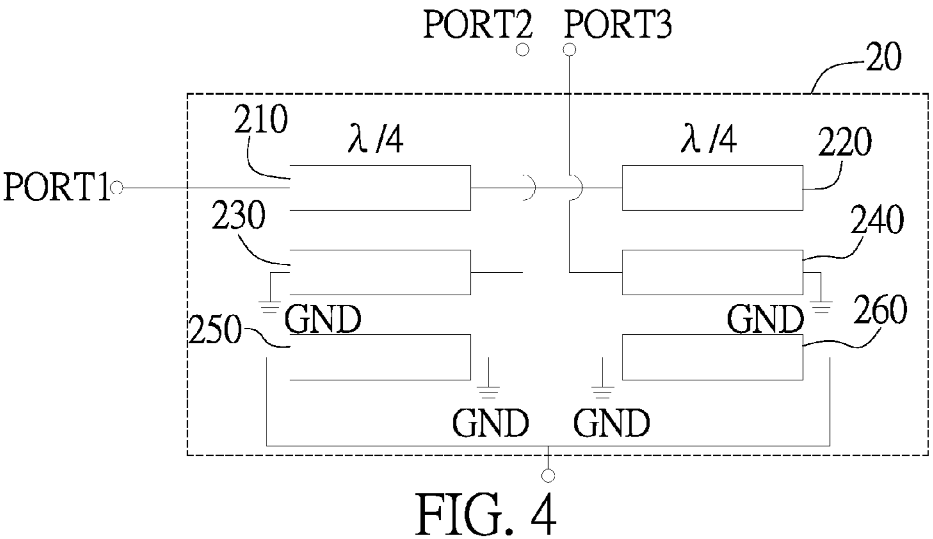
FIG. 4 is a schematic diagram showing the circuit architecture of the invention.
Figure 5:
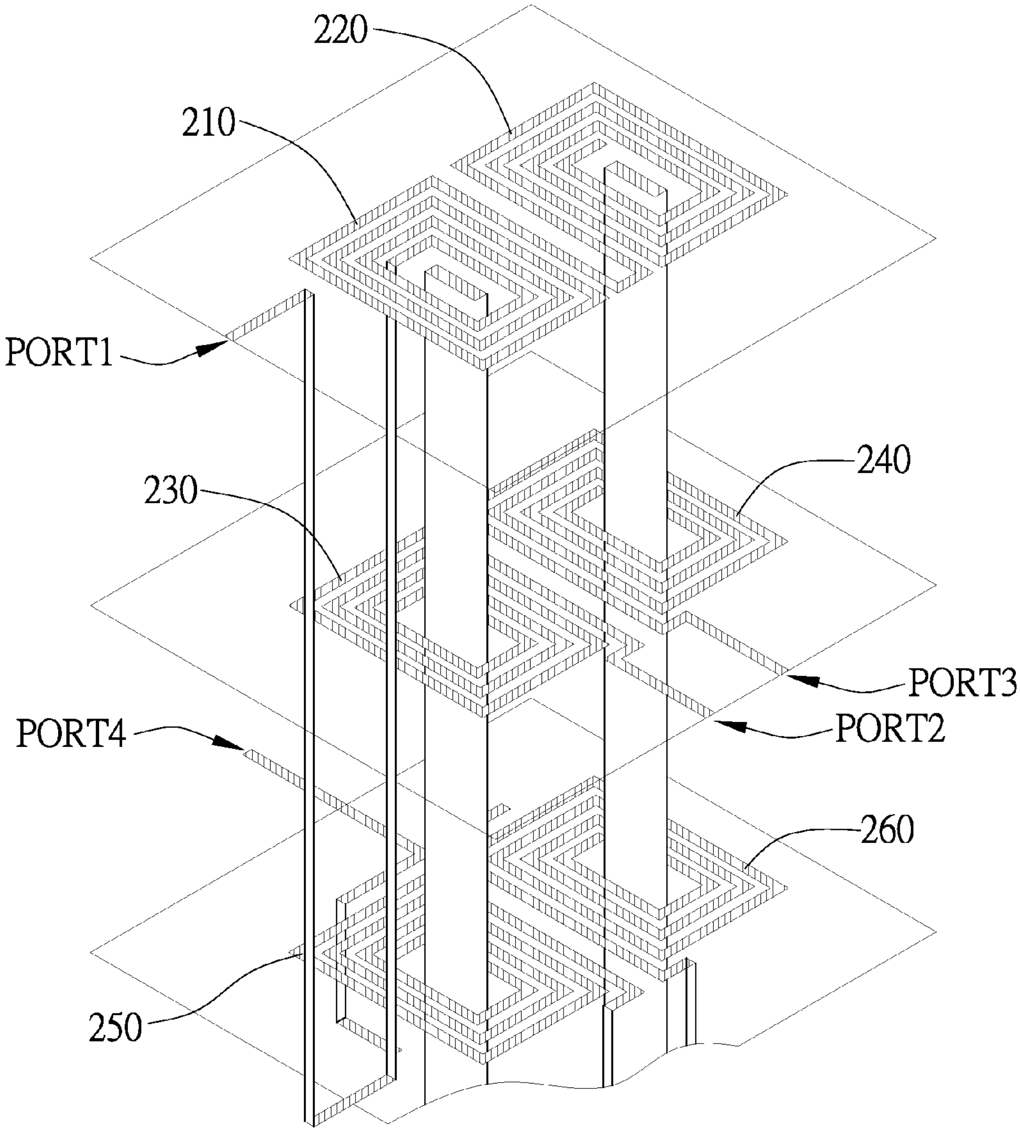
FIG. 5 is a schematic diagram showing a 3-dimensional perspective view of the IC layout of the invention.
Figure 6:
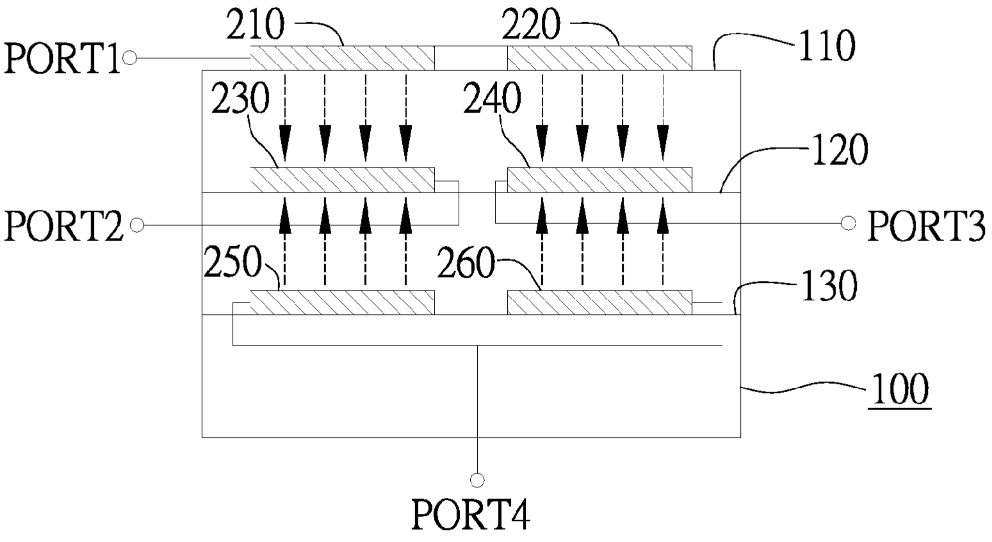
FIG. 6 is a schematic diagram showing a sectional view of the IC layout of the invention.

Referring to FIG. 4 through FIG. 6, in architecture, the hybrid-phase signal splitter circuit of the invention 20 comprises: (A) a multilayer substrate 100; (B) a first transmission line 210; (C) a second transmission line 220; (D) a third transmission line 230; (E) a fourth transmission line 240; (F) a fifth transmission line 250; and (G) a sixth transmission line 260. Firstly, the respective attributes and functions of these constituent components of the invention are described in details in the following.

The multilayer substrate 100 includes at least 3 layout planes: a first layout plane 110, a second layout plane 120, and a third layout plane 130. In practice, for example, the multilayer substrate 100 is a commercially standardized silicon substrate used in 130 nm (nanometer) CMOS fabrication technology.

The first transmission line 210 is laid over the first layout plane 110 of the multilayer substrate 100, and which has one end connected to the first port PORT1 and the other end connected to the second transmission line 220. In practice, the first transmission line 210 has a quarter-wave length (λ/4).

The second transmission line 220 is also laid over the first layout plane 110 of the multilayer substrate 100, and which has one end connected to the first transmission line 210 and the other end used as an open end. In practice, the second transmission line 220 has a quarter-wave length (λ/4).

The third transmission line 230 is laid over the second layout plane 120 of the multilayer substrate 100, and which is aligned to the overlaying first transmission line 210 on the first layout plane 110 so that the third transmission line 230 can be inductively coupled to the first transmission line 210 to form a Marchand balun. Further, the third transmission line 230 has one end connected to a grounding point GND and the other end connected to the second port PORT2. In practice, the third transmission line 230 has a quarter-wave length (λ/4).

The fourth transmission line 240 is laid over the second layout plane 120 of the multilayer substrate 100, and which is aligned to the overlaying second transmission line 220 on the first layout plane 110 so that the fourth transmission line 240 can be inductively coupled to the second transmission line 220 to form a Marchand balun. Further, the fourth transmission line 240 has one end connected to the third port PORT3 and the other end connected to the grounding point GND. In practice, the fourth transmission line 240 has a quarter-wave length (λ/4).

The fifth transmission line 250 is laid over the third layout plane 130 of the multilayer substrate 100, and which is aligned to the overlaying third transmission line 230 on the second layout plane 120 so that the fifth transmission line 250 can be inductively coupled to the third transmission line 230 to form a Marchand balun. Further, the fifth transmission line 250 has one end connected to the fourth port PORT4 and the other end connected to the grounding point GND. In practice, the fifth transmission line 250 has a quarter-wave length (λ/4).

The sixth transmission line 260 is laid over the third layout plane 130 of the multilayer substrate 100, and which is aligned to the overlaying fourth transmission line 240 on the second layout plane 120 so that the sixth transmission line 260 can be inductively coupled to the fourth transmission line 240 to form a Marchand balun. Further, the sixth transmission line 260 has one end connected to the grounding point GND and the other end connected to the fourth port PORT4. In practice, the sixth transmission line 260 has a quarter-wave length (λ/4).

Figure 7:
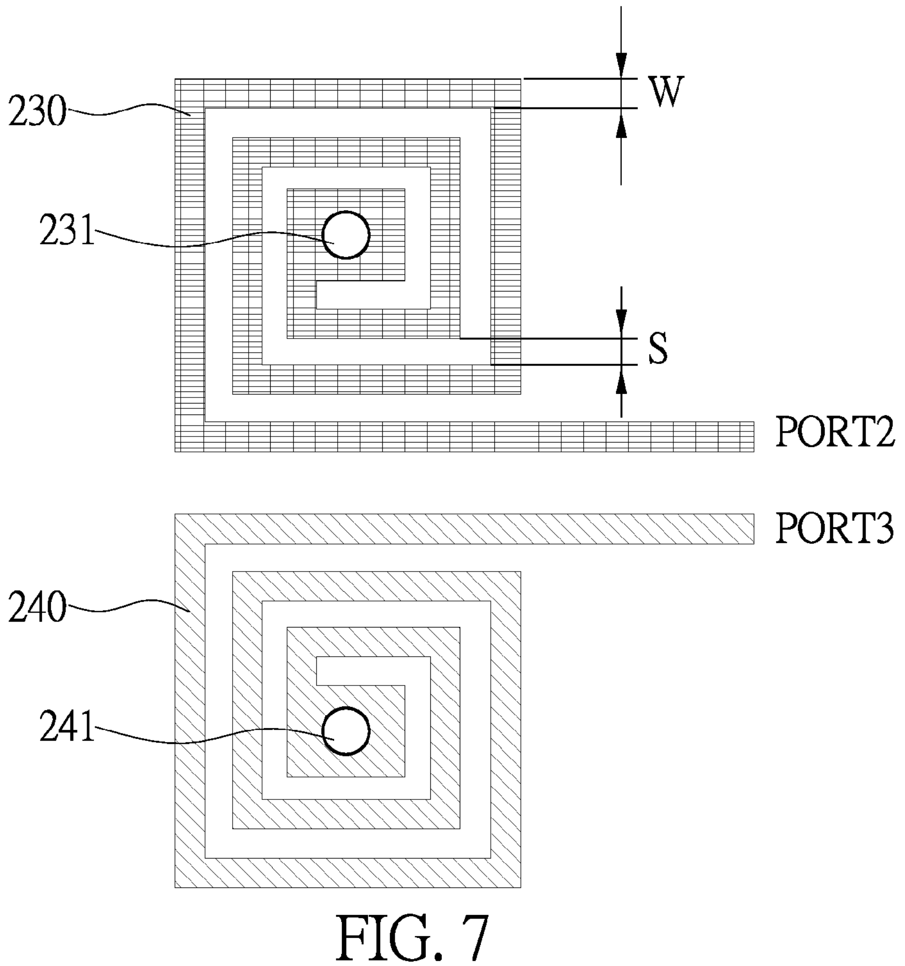
FIG. 7 is a schematic diagram showing a top plan view of the IC layout of the invention.

Further, as shown in FIG. 7, in circuit layout, the transmission lines (210, 220, 230, 240, 250, 260) are each constructed with a microstrip patterned in a spiral shape, with a line width of W and a gap of S (FIG. 7 shows the third transmission line 230 and the fourth transmission line 240 for demonstrative purpose; other transmission lines are arranged and patterned in the same manner). The respective central points (231, 232) of the spirally-shaped transmission lines (230, 240) are connected by way of vias to the ground. The topology of the spiral shape allows the transmission lines (210, 220, 230, 240, 250, 260) to be reduced in size and thus occupy a reduced layout space in IC implementation.

Moreover, in the above-mentioned Marchand balun architecture, in order to provide low insertion losses, the line width W and gap S for the transmission lines (210, 220, 230, 240, 250, 260) are preferably designed with the odd-mode characteristic impedance.

Electrical Operation of the Invention

The following is a detailed description of the electrical operation of the invention during actual operation. In this example, it is assumed that the invention is integrated to a mixer 10 shown in FIG. 2 for splitting a carrier signal RF into a pair of in-phase output signals (RF1, RF2) as well as splitting a local oscillation signal LO into a pair of opposite-phase output signals (LO1, LO2).

During operation when the hybrid-phase signal splitter circuit of the invention 20 receives the local oscillation signal LO at the first port PORT1, the received signal LO will first flow into the first transmission line 210 (which has a length of λ/4 in this embodiment), whereupon the underlying third transmission line 230 is induced to produce an electrical current having the same frequency and phase and outputted at the second port PORT2 as the output signal LO1. Subsequently, the received signal LO flows onwards into the second transmission line 220 (which has a length of λ/4 in this embodiment). At this point, since the received signal LO has passed through two λ/4 transmission lines, its phase has a change of ½ wavelength, i.e., 180 degrees. Similarly, the underlying fourth transmission line 240 is also induced to produce an electrical current having the same frequency and a phase change of 180 degrees and outputted at the third port PORT3 as the output signal LO2.

As a summary, in response to the input of the local oscillation signal LO, the invention will output a pair of opposite-phase differential signals (LO1, LO2) which have the same frequency as LO and a phase difference of 180 degrees.

On the other hand, when the hybrid-phase signal splitter circuit of the invention 20 receives the carrier signal RF at the fourth port PORT4, the received signal RF will flow in parallel into both the fifth transmission line 250 and the sixth transmission line 260 (which are both λ/4 transmission lines in this embodiment), hereupon the overlying third transmission line 230 and the fourth transmission line 240 are both induced through inductive coupling to produce an electrical current having the same frequency and phase. The induced current in the third transmission line 230 is then outputted at the second port PORT2 as the output signal RF1, whereas the induced current in the fourth transmission line 240 is outputted at the third port PORT3 as the output signal RF2.

As a summary, in response to the input of the carrier signal RF, the invention will output a pair of in-phase signals (RF1, RF2) which have the same frequency as RF and a phase difference of 0 degree (i.e., in phase).

Performance of the Invention

Figure 8A:
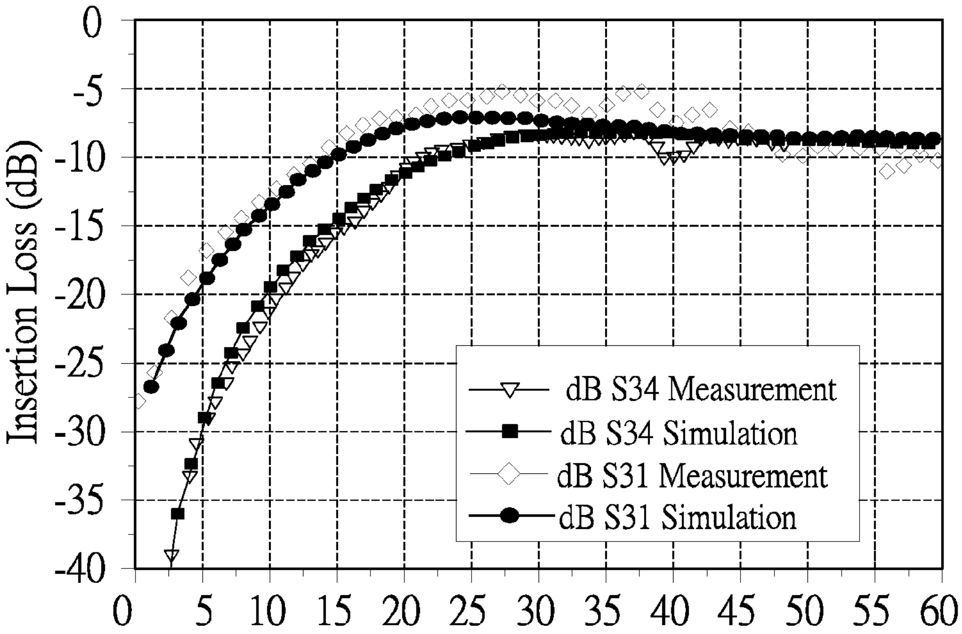
FIG. 8A is a graph showing the insertion loss versus frequency characteristic plots for the invention.

FIG. 8A is a graph showing the insertion loss versus frequency characteristic plots for the invention. It can be seen from the graph that within the frequency range from 30 GHz to 60 GHz, the invention has an insertion loss of approximately −7 dB.

Figure 8B:
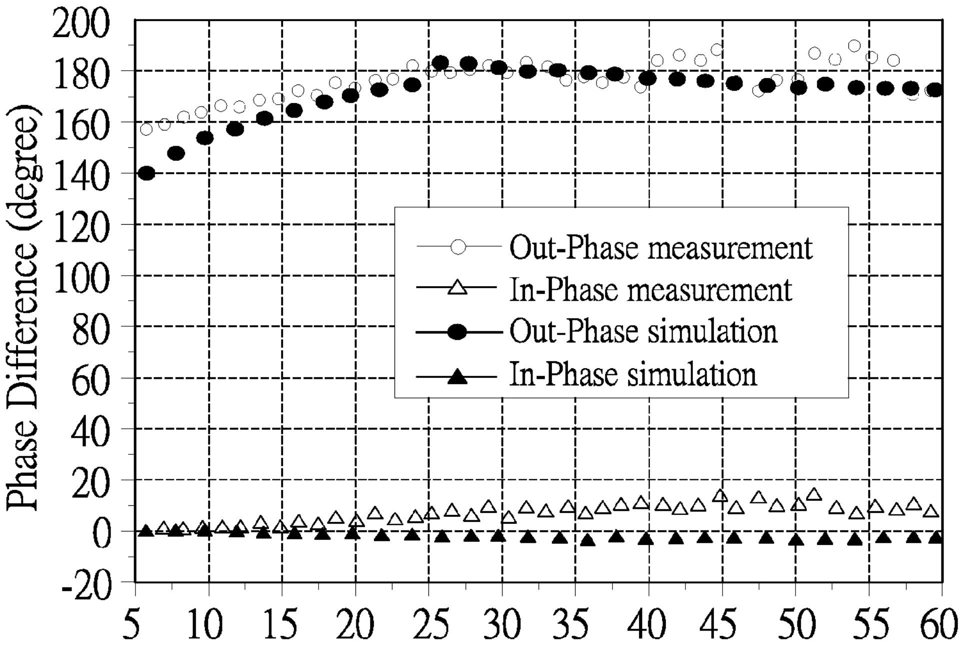
FIG. 8B is a graph showing the phase versus frequency characteristic plots for the invention.

FIG. 8B is a graph showing the phase versus frequency characteristic plots for the invention. In this graph, the bottom pair of curves are plotted for the in-phase output signals (RF1, RF2), whereas the upper pair of curves are plotted for the opposite-phase output signals (LO1, LO2). It can be seen from this graph that within the frequency range from 30 GHz to 60 GHz, the in-phase output signals (RF1, RF2) have a phase error of about 8 degrees, whereas the opposite-phase output signals (LO1, LO2) have a phase error of about 10 degrees.

Advantage of the Invention

Compared to the conventional rat-race coupler, the invention has the advantage of a miniaturized size for IC implementation by using a multilayer substrate (3-layer substrate) for the layout of 6 transmission lines and a spiral topology for the patterning of these 6 transmission lines. Specifically speaking, the conventional rat-race coupler requires a layout area of about the square of ¾ wavelength for IC implementation, whereas the invention only requires a layout area of about the square of ⅙ wavelength. In other words, the required layout area for the invention is only about 10% of the layout area for the conventional rat-race coupler. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and functional equivalent arrangements. The scope of the claims, therefore, should be accorded the broadest interpretation so as to encompass all such modifications and functional equivalent arrangements.

What is claimed is:

1. A miniaturized multilayer hybrid-phase signal splitter circuit with an input/output having a first port, a second port, a third port, and a fourth port, wherein when the first port receives a first input signal, a pair of opposite-phase output signals are outputted respectively at the second port and the third port; whereas when the fourth port receives a second input signal, a pair of in-phase output signals are outputted respectively at the second port and the third port;

the miniaturized multilayer hybrid-phase signal splitter circuit comprising:

a multilayer substrate, which includes at least a first layout plane, a second layout plane, and a third layout plane;

a first transmission line, which is laid on the first layout plane of the multilayer substrate and has a first end and a second end, and whose first end is connected to the first port;

a second transmission line, which is laid on the first layout plane of the multilayer substrate and has a first end and a second end, and whose first end is connected to the second end of the second transmission line;

a third transmission line, which is laid on the second layout plane of the multilayer substrate and has a first end and a second end, and whose first end is connected to a grounding point and whose second end is connected to the second port;

a fourth transmission line, which is laid on the second layout plane of the multilayer substrate and has a first end and a second end, and whose first end is connected to the third port and whose second end is connected to a grounding point;

a fifth transmission line, which is laid on the third layout plane of the multilayer substrate and has a first end and a second end, and whose first end is connected to the fourth port and whose second end is connected to a grounding point; and a sixth transmission line, which is laid on the third layout plane of the multilayer substrate and has a first end and a second end, and whose first end is connected to a grounding point and whose second end is connected to the fourth port.

2. The miniaturized multilayer hybrid-phase signal splitter circuit of claim 1, which is integrated to a mixer for providing a hybrid signal splitting function.

3. The miniaturized multilayer hybrid-phase signal splitter circuit of claim 1, which is used as a power splitter.

4. The miniaturized multilayer hybrid-phase signal splitter circuit of claim 1, which is used as a phase shifter.

5. The miniaturized multilayer hybrid-phase signal splitter circuit of claim 1, wherein the multilayer substrate is a commercially standardized silicon substrate used in 130 nm (nanometer) CMOS fabrication technology.

6. The miniaturized multilayer hybrid-phase signal splitter circuit of claim 1, wherein the first transmission line is a quarter-wavelength microstrip line.

7. The miniaturized multilayer hybrid-phase signal splitter circuit of claim 1, wherein the second transmission line is a quarter-wavelength microstrip line.

8. The miniaturized multilayer hybrid-phase signal splitter circuit of claim 1, wherein the third transmission line is a quarter-wavelength microstrip line.

9. The miniaturized multilayer hybrid-phase signal splitter circuit of claim 1, wherein the fourth transmission line is a quarter-wavelength microstrip line.

10. The miniaturized multilayer hybrid-phase signal splitter circuit of claim 1, wherein the fifth transmission line is a quarter-wavelength microstrip line.

11. The miniaturized multilayer hybrid-phase signal splitter circuit of claim 1, wherein the sixth transmission line is a quarter-wavelength microstrip line.

12. The miniaturized multilayer hybrid-phase signal splitter circuit of claim 1, wherein the first transmission line is patterned with a spiral topology.

13. The miniaturized multilayer hybrid-phase signal splitter circuit of claim 1, wherein the second transmission line is patterned with a spiral topology.

14. The miniaturized multilayer hybrid-phase signal splitter circuit of claim 1, wherein the third transmission line is patterned with a spiral topology.

15. The miniaturized multilayer hybrid-phase signal splitter circuit of claim 1, wherein the fourth transmission line is patterned with a spiral topology.

16. The miniaturized multilayer hybrid-phase signal splitter circuit of claim 1, wherein the fifth transmission line is patterned with a spiral topology.

17. The miniaturized multilayer hybrid-phase signal splitter circuit of claim 1, wherein the sixth transmission line is patterned with a spiral topology.

18. The miniaturized multilayer hybrid-phase signal splitter circuit of claim 1, wherein the first transmission line, the second transmission line, the third transmission line, the fourth transmission line, the fifth transmission line, and the fifth transmission line are patterned with a line width and a gap based on odd-mode characteristic impedance.

19. A miniaturized multilayer hybrid-phase signal splitter circuit with an input/output having a first port, a second port, a third port, and a fourth port, wherein when the first port receives a first input signal, a pair of opposite-phase output signals are outputted respectively at the second port and the third port; whereas when the fourth port receives a second input signal, a pair of in-phase output signals are outputted respectively at the second port and the third port;

a multilayer substrate, which includes at least a first layout plane, a second layout plane, and a third layout plane;

a first transmission line, which is a quarter-wavelength microstrip patterned in a spiral topology, and which is laid on the first layout plane of the multilayer substrate and has a first end and a second end, and whose first end is connected to the first port;

a second transmission line, which is a quarter-wavelength microstrip patterned in a spiral topology, and which is laid on the first layout plane of the multilayer substrate and has a first end and a second end, and whose first end is connected to the second end of the second transmission line;

a third transmission line, which is a quarter-wavelength microstrip patterned in a spiral topology, and which is laid on the second layout plane of the multilayer substrate and has a first end and a second end, and whose first end is connected to a grounding point and whose second end is connected to the second port;

a fourth transmission line, which is a quarter-wavelength microstrip patterned in a spiral topology, and which is laid on the second layout plane of the multilayer substrate and has a first end and a second end, and whose first end is connected to the third port and whose second end is connected to a grounding point;

a fifth transmission line, which is a quarter-wavelength microstrip patterned in a spiral topology, and which is laid on the third layout plane of the multilayer substrate and has a first end and a second end, and whose first end is connected to the fourth port and whose second end is connected to a grounding point; and a sixth transmission line, which is a quarter-wavelength microstrip patterned in a spiral topology, and which is laid on the third layout plane of the multilayer substrate and has a first end and a second end, and whose first end is connected to a grounding point and whose second end is connected to the fourth port.

20. The miniaturized multilayer hybrid-phase signal splitter circuit of claim 19, which is integrated to a mixer for providing a hybrid signal splitting function.

21. The miniaturized multilayer hybrid-phase signal splitter circuit of claim 19, which is used as a power splitter.

22. The miniaturized multilayer hybrid-phase signal splitter circuit of claim 19, which is used as a phase shifter.

23. The miniaturized multilayer hybrid-phase signal splitter circuit of claim 19, wherein the multilayer substrate is a commercially standardized silicon substrate used in 130 nm (nanometer) CMOS fabrication technology.

24. The miniaturized multilayer hybrid-phase signal splitter circuit of claim 19, wherein the first transmission line, the second transmission line, the third transmission line, the fourth transmission line, the fifth transmission line, and the fifth transmission line are patterned with a line width and a gap based on odd-mode characteristic impedance.

* * * * *